(12) United States Patent
Yano et al.

(10) Patent No.: US 11,798,628 B2
(45) Date of Patent: Oct. 24, 2023

(54) SEMICONDUCTOR MEMORY APPARATUS ADOPTING NEW ISPP METHOD WITH SACRIFICIAL PROGRAMMING PULSE AND PROGRAMMING METHOD THEREOF

(71) Applicant: Winbond Electronics Corp., Taichung (TW)

(72) Inventors: Masaru Yano, Kanagawa (JP); Toshiaki Takeshita, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/462,006

(22) Filed: Aug. 31, 2021

(65) Prior Publication Data
US 2022/0068393 A1     Mar. 3, 2022

(30) Foreign Application Priority Data
Aug. 31, 2020 (JP) ................. 2020-145274

(51) Int. Cl.
    *G11C 16/04*     (2006.01)
    *G11C 16/10*     (2006.01)
    *G11C 16/34*     (2006.01)

(52) U.S. Cl.
    CPC .......... *G11C 16/10* (2013.01); *G11C 16/0483* (2013.01); *G11C 16/349* (2013.01); *G11C 16/3459* (2013.01)

(58) Field of Classification Search
CPC . G11C 16/10; G11C 16/0483; G11C 16/3459; G11C 16/349; G11C 16/3486; G11C 2211/5644; G11C 2211/5646; G11C 5/147; G11C 16/34; G11C 16/14; G06F 3/0656; G06F 12/0882

(Continued)

(56) References Cited

U.S. PATENT DOCUMENTS 7,349,263 B2    3/2008   Kim et al.
8,446,776 B2 *   5/2013   Hwang ............... G11C 11/5628
                                                                                  365/185.24

(Continued)

FOREIGN PATENT DOCUMENTS

JP     H11110977     4/1999
JP     H11134879     5/1999

(Continued)

OTHER PUBLICATIONS

Office Action of Japan Counterpart Application, with English translation thereof, dated Jan. 26, 2022, pp. 1-8.

(Continued)

*Primary Examiner* — Tha-O H Bui
(74) *Attorney, Agent, or Firm* — JCIPRNET

(57) ABSTRACT

A semiconductor storage apparatus programming a memory cell through improved ISPP is introduced. A NAND flash memory programming method includes a step of selecting a page of a memory cell array and applying a programming pulse based on the ISPP to the selected page. The programming pulse applied by the ISPP includes a sacrificial programming pulse for which a program verification becomes unqualified due to an initial programming pulse and a last programming pulse having an increment larger than any increment of other programming pulses.

12 Claims, 7 Drawing Sheets

(58) Field of Classification Search
USPC .................................................. 365/185.17
See application file for complete search history.

(56) References Cited

U.S. PATENT DOCUMENTS

| | | | |
|---|---|---|---|
| 9,165,662 B2 | 10/2015 | Kim et al. | |
| 9,514,823 B2 | 12/2016 | Melik-Martirosian | |
| 10,304,543 B2* | 5/2019 | Senoo | G11C 16/16 |
| 10,366,769 B2* | 7/2019 | Cho | G11C 16/10 |
| 10,659,050 B2* | 5/2020 | Okabe | G11C 8/08 |
| 2003/0235080 A1* | 12/2003 | Yaegashi | G11C 16/3468 |
| | | | 365/185.17 |
| 2005/0235080 A1* | 10/2005 | El-Batal | G06F 3/0613 |
| | | | 710/74 |
| 2005/0248992 A1 | 11/2005 | Hwang et al. | |
| 2007/0253256 A1 | 11/2007 | Aritome | |
| 2009/0285028 A1 | 11/2009 | Park | |
| 2010/0124122 A1 | 5/2010 | Jeong et al. | |
| 2010/0232227 A1 | 9/2010 | Lee | |
| 2011/0161571 A1 | 6/2011 | Kim et al. | |
| 2013/0159610 A1 | 6/2013 | Kawamura | |

FOREIGN PATENT DOCUMENTS

| | | |
|---|---|---|
| JP | 2004023044 | 1/2004 |
| JP | 2005322248 | 11/2005 |
| JP | 2009283117 | 12/2009 |
| JP | 2013125574 | 6/2013 |
| JP | 5583185 | 9/2014 |
| TW | I663600 | 6/2019 |

OTHER PUBLICATIONS

Office Action of Japan Counterpart Application, with English translation thereof, dated Jul. 28, 2021, pp. 1-8.
"Office Action of Japan Counterpart Application", with English translation thereof, dated May 11, 2022, p. 1-p. 8.

* cited by examiner

SEMICONDUCTOR MEMORY APPARATUS ADOPTING NEW ISPP METHOD WITH SACRIFICIAL PROGRAMMING PULSE AND PROGRAMMING METHOD THEREOF

CROSS-REFERENCE TO RELATED APPLICATION

This application claims the priority benefit of Japan application serial no. 2020-145274, filed on Aug. 31, 2020. The entirety of the above-mentioned patent application is hereby incorporated by reference herein and made a part of this specification.

BACKGROUND OF THE INVENTION

Field of the Invention

The invention relates to a flash memory, and in particular to a NAND flash memory and a programming method of the NAND flash memory.

Description of Related Art

In a NAND flash memory, programming involves storing electrons in a floating gate to move the threshold voltage of a memory cell in the positive direction, and erasing involves releasing electrons from the floating gate, so that the threshold voltage of the memory cell is moved in the negative direction.

In order to control the threshold distribution of the memory cell, the programming of the memory cell adopts an incremental step pulse program (ISPP) method. As shown in FIG. 1, ISPP applies a programming pulse Vpgm0 to a selected page, and applies a programming pulse Vpgm1 higher than the programming pulse Vpgm0 by one step voltage to a memory cell determined as unqualified in first program verification. If the memory cell applied with the programming pulse Vpgm1 is still determined as unqualified in second program verification, then a programming pulse Vpgm2 higher than the programming pulse Vpgm1 by one step voltage is applied to the memory cell. The programming pulse is gradually increased, and the threshold of the memory cell corresponding to the step voltage is changed, thereby achieving a narrowing of the threshold distribution range (for example, Prior Art 1: Japanese Patent No. 5583185).

In a flash memory, if the number of programming/erase cycles is increased, then the deterioration of Gm (transconductance) becomes significant, and it becomes difficult for current to flow into the memory cell. In other words, as the number of programming/erase cycles is increased, the threshold of the memory cell rises. Programming the memory cell increases the threshold of the memory cell, which means that the programming of the memory cell becomes easier due to the increase in the number of cycles. That is, the programming speed of the memory cell becomes faster, or the ability to perform programming is accelerated.

FIG. 2 is a graph showing the cycle characteristics of programming/erasing. The vertical axis is the threshold of a memory cell, and the horizontal axis is the number of programming/erase cycles. The upper broken line is the threshold of the memory cell in a programming state, and the lower broken line is the threshold of the memory cell in an erase state. Here, the cycle characteristics of four products with different generations are shown. The programming/erasing cycle characteristics may be obtained, for example, by repeatedly applying a programming pulse with a fixed voltage and an erase pulse with a fixed voltage. As shown in this figure, it may be seen that the threshold of the memory cell in the programming state or the erase state is hardly changed until the number of cycles is around 1K. However, from around over 1K, the threshold is gradually moved in the positive direction. It is speculated that one of the reasons is that as the number of programming/erase cycles is increased, electrons are captured by the gate-oxide film, or the gate-oxide film itself is deteriorated due to electron tunneling.

When the number of cycles becomes around 100K, the threshold of the memory cell in the programming state is significantly increased compared to the threshold when the memory cell is new, and the programming speed or the programming ability is accelerated. If the program verification voltage is the same, then the memory cell with a cycle number of 100K passes program verification at a lower programming voltage.

FIG. 3 shows an example of a conventional programming pulse based on ISPP. The programming pulse here is a consistent step voltage ($\Delta V=0.6$ V), and the initial voltage is 14.0 V. The step voltage defines the shift amount of the threshold of the memory cell. By making the step voltage consistent, the shift amount of the threshold of the memory cell is controlled to achieve a narrowing of the threshold distribution. For example, a memory cell with a number of cycles of less than 1K or a new memory cell passes program verification at a programming voltage of 15.2 V, but a memory cell with a number of cycles of around 100K passes program verification at a programming voltage of 14.0 V.

The programming using ISPP ideally involves controlling the threshold change of the memory cell through multiple applications of a programming pulse. However, as mentioned above, a memory cell with an accelerated programming speed due to the increase in the number of cycles passes verification through one programming pulse. This means that the programming voltage is too large for a memory cell with a fast programming speed, and the shift amount of the threshold becomes too large, which is not controlled by ISPP. In other words, the threshold of such a memory cell is readily deviated from the threshold distribution. In addition, a memory cell with a fast programming speed is subject to a large programming stress, so the deterioration is further aggravated and the programming speed is further accelerated. As a result, the durability characteristics (the number of times the data may be rewritten) are also reduced.

SUMMARY OF THE INVENTION

A semiconductor storage apparatus of the invention has: a NAND memory cell array; and a controller configured to apply a programming pulse based on ISPP in order to program a selected page of the memory cell array; wherein the programming pulse includes at least one sacrificial programming pulse such that a memory cell of the selected page cannot pass a program verification after being applied with the at least one sacrificial programming pulse, and the at least one sacrificial programming pulse includes an initial programming pulse.

A programming method of a NAND flash memory of the invention includes a step of applying a programming pulse based on ISPP in order to program a selected page of a memory cell array. The applied programming pulse includes at least one sacrificial programming pulse such that a memory cell of the selected page cannot pass a program verification after being applied with the at least one sacrificial programming pulse, and the at least one sacrificial programming pulse includes an initial programming pulse.

According to the invention, a sacrificial programming pulse for which a program verification becomes unqualified due to an initial programming pulse is applied. Therefore, even for a memory cell with a fast programming speed due to the increase in the number of programming/erase cycles, the shift amount of the threshold is also controlled to be fixed or less, so that the threshold of the memory cell in the programming state may be narrowed. In addition, the deterioration of the memory cell with a fast programming speed may be suppressed to improve the durability characteristics of the memory cell.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 4:
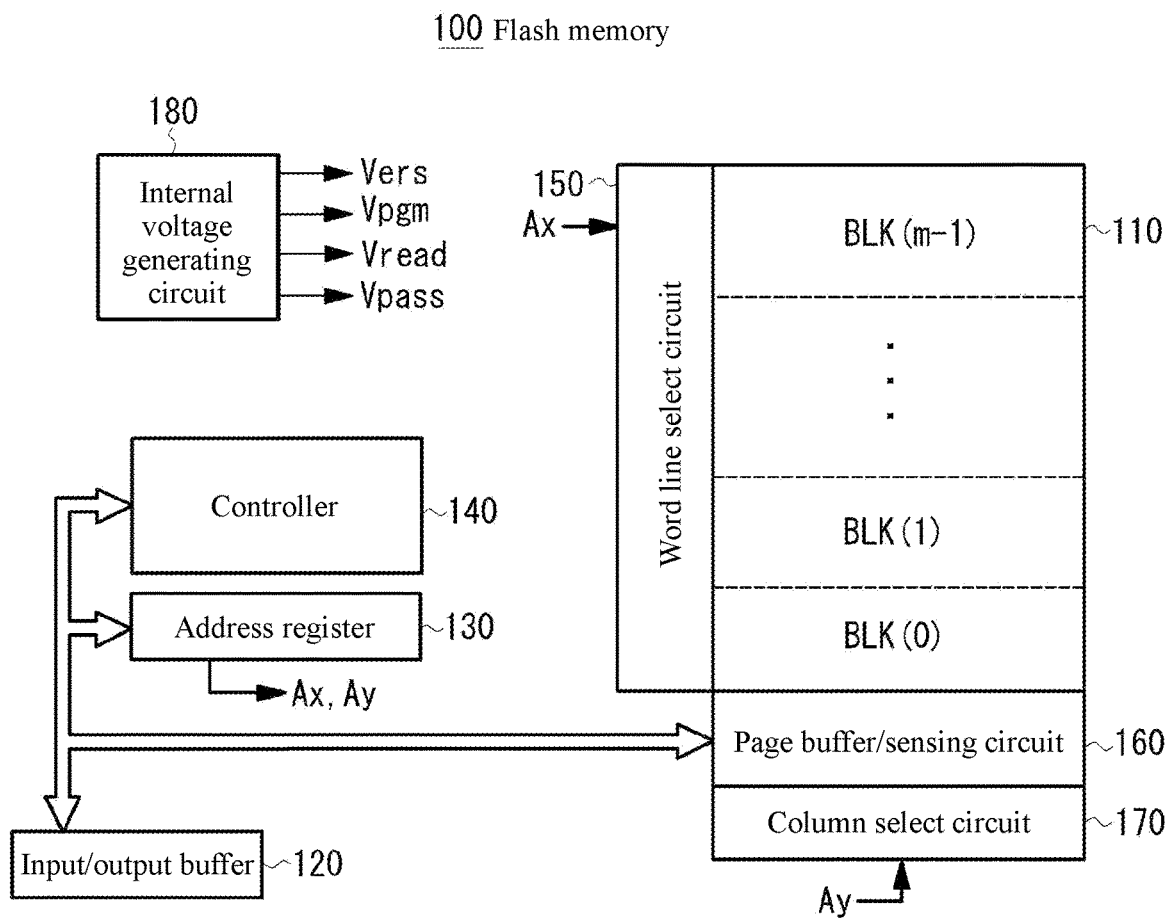
FIG. 4 is a block diagram illustrating the structure of a NAND flash memory of an embodiment of the invention.

As shown in FIG. 4, a flash memory 100 of the present embodiment includes: a memory cell array 110 including a plurality of memory cells; an input/output buffer 120 connected to an external input/output terminal I/O; an address register 130 receiving an address data from the input/output buffer 120; a controller 140 receiving a command data, etc. from the input/output buffer 120, and controlling each part of the flash memory 100; a word line select circuit 150 receiving a row address information Ax from the address register 130 and performing block selection and word line selection, etc. according to the decoding result of the row address information Ax; a page buffer/sensing circuit 160 retaining a read data of a page selected by the word line select circuit 150 or retaining a programming data that should be programmed to the selected page; a column select circuit 170 receiving a column address information Ay from the address register 130 and selecting a column, etc. in the page buffer/sensing circuit 160 according to the decoding result of the column address information Ay; and an internal voltage generating circuit 180 generating various voltages (a programming voltage Vpgm, a read voltage Vread, an erase voltage Vers, a pass voltage Vpass, etc.) needed for reading, programming, erasing, etc.

The memory cell array 110 has an m number of blocks BLK(0), BLK(1) . . . BLK(m−1), and a plurality of NAND strings are formed in one block. One NAND string includes a plurality of memory cells connected in series, a bit line side select transistor, and a source line side select transistor. The NAND string may be a two-dimensional structure formed on the surface of the substrate, or a three-dimensional structure formed from the surface of the substrate in a vertical direction. The controller 140 includes a microcontroller or a state machine including read-only memory (ROM)/random-access memory (RAM). In an embodiment of the invention, the controller 140 executes a program stored in the ROM to control a read operation, a programming operation, an erase operation, and the like.

In a read operation, a positive voltage is applied to a bit line, 0 V is applied to a selected word line, for example, a pass voltage is applied to a non-selected word line, the bit line side select transistor and the source line side select transistor are turned on, and 0 V is applied to a common source line. In a programming operation, the high-voltage programming voltage Vpgm is applied to a selected word line and an intermediate potential is applied to a non-selected word line, such that the bit line side select transistor is turned on and the source line side select transistor is turned off, and the voltage corresponding to the data of "0" or "1" is provided to the bit line. In the programming operation, the so-called ISPP method is used in which, after a programming pulse is applied, a programming pulse with a step voltage higher than the previous time is applied to a memory cell for which a program verification became unqualified. In an erase operation, a block is selected, 0 V is applied to a selected word line in the selected block, a high voltage is applied to a P-well, and data is erased in units of blocks.

Next, the programming operation of the present embodiment is described. The ISPP based on the present embodiment does not linearly increase the programming voltage through a consistent step voltage, but applies a programming pulse improving the initial voltage and the step voltage of the programming pulse in consideration of the increase in the threshold or the acceleration of the programming ability caused by the number of programming/erase cycles.

Among memory cells, due to manufacturing deviation and other factors, there are a memory cell with a relatively fast programming speed (a memory cell with a large threshold shift) and a memory cell with a relatively slow programming speed (a memory cell with a small threshold shift). The conventional ISPP sets the initial voltage and the step voltage of the programming pulse on the basis of a memory cell which has undergone a small number of programming/erase cycles or which is new. Regardless of whether a memory cell has a fast or slow programming speed, in order to control the threshold of the memory cell, programming voltage may be increased step by step and linearly using the conventional ISPP. However, as the number of programming/erase cycles is increased, the programming speed of a memory cell with a fast programming speed is further accelerated, and as a result, the memory cell with a fast programming speed may pass verification through only one programming pulse. This deviates from the ISPP threshold control and generates a large threshold distribution.

In the present embodiment, one or a plurality of sacrificial programming pulses are applied to a memory cell in order to perform threshold control using ISPP for a memory cell with a fast programming speed as described above. The sacrificial programming pulse has an initial voltage and a step voltage slightly shifting the threshold of a memory cell with a fast programming speed. In other words, a memory cell with a fast programming speed fails the program verification after being applied with the sacrificial programming pulse. Moreover, if the voltage level finally reached by the programming pulse becomes too small due to the inclusion of such sacrificial programming pulse, then there is a concern that a memory cell with a slow programming speed that originally should be qualified in the verification becomes unqualified. Therefore, the step voltage of the last applied programming pulse is increased to prevent the memory cell with a slow programming speed from becoming unqualified in the verification.

Figure 5:
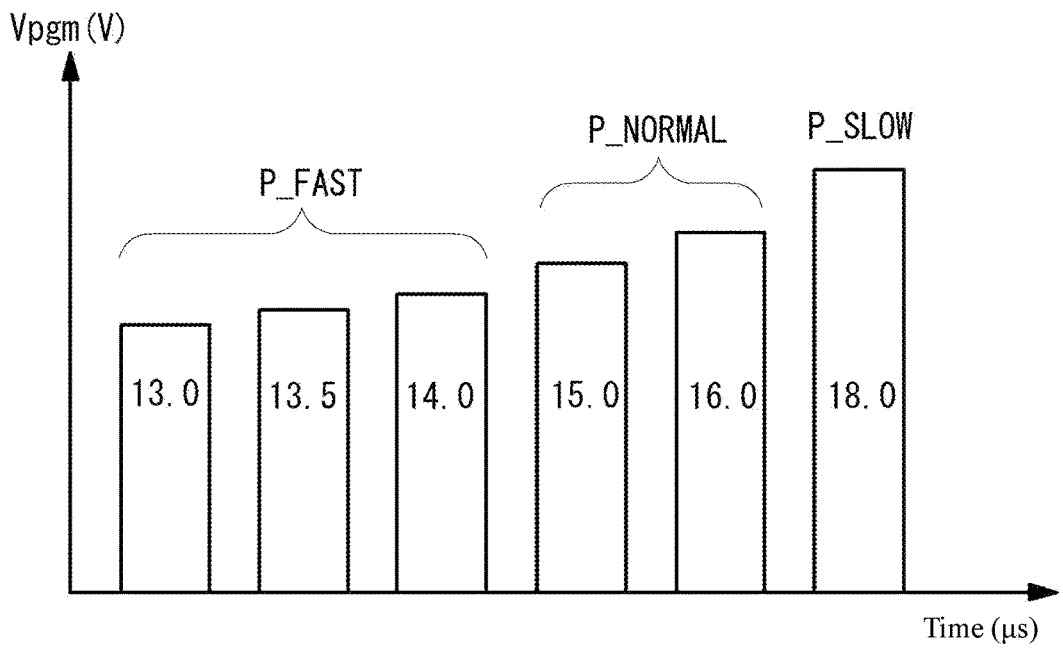
FIG. 5 is an illustration of programming pulse voltages based on ISPP of an embodiment of the invention.

Referring to FIG. 5, in the present embodiment, all of the memory cells in the selected page are verified as pass after being applied with the six programming pulses. In this figure, a memory cell with a fast programming speed is verified as pass after being applied with the programming pulses P_FAST including an initial voltage and 2 following voltages incremented by a small step voltage. That is, there are two sacrificial programming pulses (13 V and 13.5 V) during the programming operation. A memory cell with a standard programming speed is verified as pass after being applied with the programming pulses P_FAST and P_NORMAL, in which the programming pulse P_NORMAL is the programming pulse with a median step voltage greater than the small step voltage. A memory cell with a slow programming speed is verified as pass after being applied with the programming pulses P_FAST and P_NORMAL, and P_SLOW, in which the programming pulse P_SLOW is a programming pulse with a large step voltage greater than the median step voltage.

Figure 3:
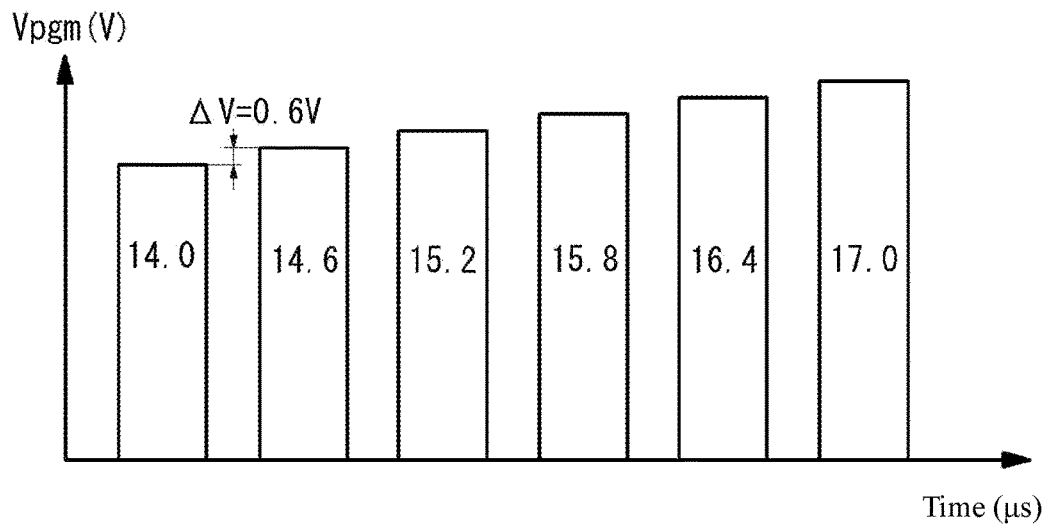
FIG. 3 is a diagram illustrating a specific example of a conventional programming pulse voltage based on ISPP.

In the conventional ISPP shown in FIG. 3, when the number of programming/erase cycles reached approximately 100K, a memory cell with a fast programming speed passes verification, for example, at the initial 14.0 V. In order to cope with this situation, in the ISPP shown in FIG. 5, the initial voltage of the programming pulse P_FAST is set to 13.0 V, and the step voltage is set to 0.5 V. The initial voltage and the step voltage of the programming pulse P_FAST are less than the initial voltage and the step voltage of the programming pulse used for programming a new memory cell. As a result, the memory cell with a fast programming speed will not pass the program verification following the initial programming pulse, and is estimated to pass the program verification after the third programming pulse, for example, 14.0 V, is applied.

The programming pulse P_NORMAL has a higher programming voltage and higher step voltage than that of the programming pulse P_FAST, such that the memory cell with a standard programming speed can pass verification when the programming pulse P_NORMAL is applied.

The step voltage of the programming pulse P_SLOW is 2.0 V, which is set by applying a large programming voltage at the end. As a result, a memory cell with a slow programming speed should pass verification after applied with the programming pulse P_SLOW. The step voltage (2 V) of the programming pulse P_SLOW is larger than the step voltage (1 V) of the programming pulse P_NORMAL, and the programming voltage (18 V) is also larger than the programming voltage (17 V) of the normal ISPP shown in FIG. 3. By applying such a programming pulse P_SLOW, a large programming stress is applied to the memory cell having a slow programming speed, thereby accelerating programming.

Figure 1:
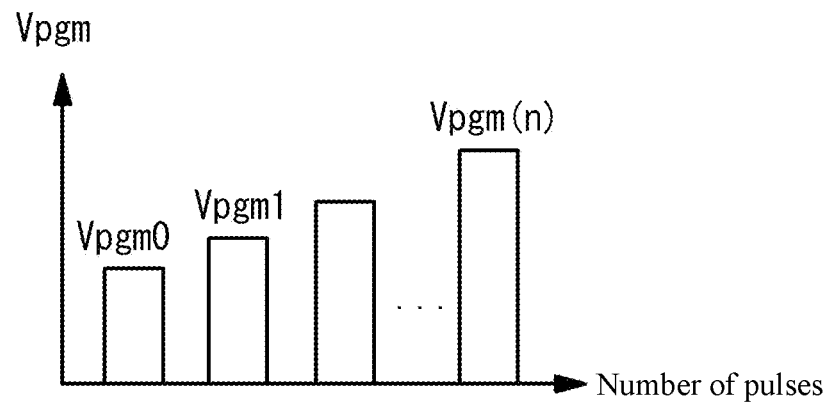
FIG. 1 is a diagram illustrating programming using ISPP of a conventional flash memory.
Figure 2:
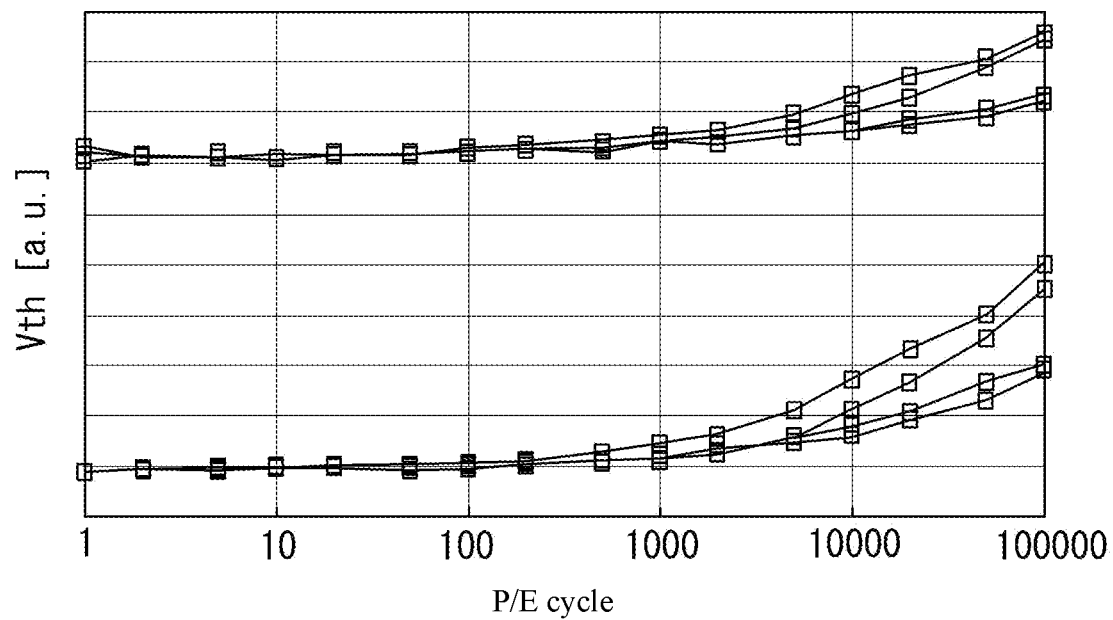
FIG. 2 is a graph illustrating the relationship between programming/erase cycle and threshold change.

As a result, the ISPP-based programming pulses of the present embodiment starts with the programming pulse P_FAST in which the initial voltage and the step voltage are low and slowly increasing, then becomes the programming pulse P_NORMAL that makes the step voltage slightly larger, and finally becomes the programming pulse P_SLOW that makes the step voltage very large. For setting the initial voltage and the step voltages of the programming pulses of the present embodiment, a cycle test of the flash memory 100 is actually performed. Then, the initial voltage and the step voltages of the programming pulses are determined according to the relationship between the number of programming/erase cycles and the threshold obtained from the results of the cycle test (for example, the graph shown in FIG. 2).

In addition, the NAND flash memory usually stores setting information for a setting parameter such as operating voltage or operating timing in a fuse memory. In a power-on operation, the setting information read from the fuse memory is loaded into a configuration register, etc., and the controller 140 sets the initial voltage or the step voltages of the ISPP according to the setting information set in the configuration register. The fuse memory is provided, for example, in an area of the memory cell array 110 that is not used by the user.

Figure 6:
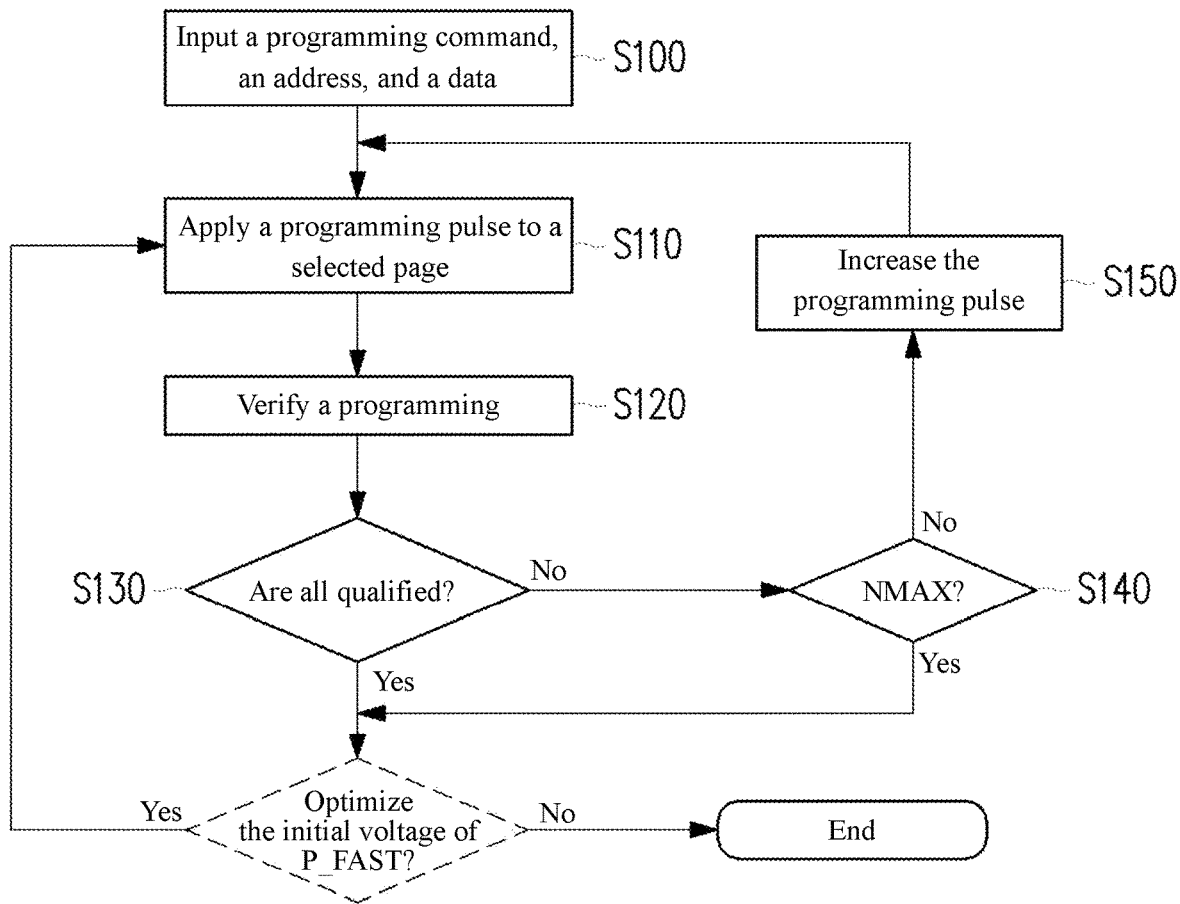
FIG. 6 is a flowchart illustrating the sequence of a programming operation of the first embodiment of the invention.

FIG. 6 is a flowchart showing the programming operation of the first embodiment of the invention. When receiving a programming command, an address, and data to be programmed from the outside via the input/output buffer 120 (S100), the controller 140 starts a programming sequence. A programming pulse is applied to a word line of a selected page through the word line select circuit 150, and a voltage corresponding to the data to be programmed is set on a bit line through the page buffer/sensing circuit 160 (S110). After the programming pulse is applied to the selected page, a program verification is performed (S120). When all of the memory cells in the selected page pass the program verification (S130), the programming is ended.

On the other hand, when there is a memory cell fails the program verification (S130), it is determined whether or not the number of times the programming pulse is applied reaches NMAX (S140). Here, NMAX means the maximum time allowed in the programming or the maximum number of the programming pulses cumulatively applied to the selected page allowed in the programming. Generally, from the point of view of programming disturbance, there is a limit to the number of times (number of programming (NOP)) that can be continuously programmed on the same page.

When the number of times the programming pulse is applied reaches NMAX, the status of programming failure is notified to an external host device, and the block is managed as a bad block. If NMAX is not reached, the programming pulse is increased according to ISPP. That is, the internal voltage generating circuit 180 generates a programming pulse having a step voltage larger than the previous programming pulse by $\Delta V$ (S150), and applies this increased programming pulse to the selected page (S110). In the same time, a programming prohibition voltage is applied to the bit line(s) of the memory cell(s) that have already passed the program verification.

Next, the second embodiment of the invention is described. In the first embodiment, the programming pulses of ISPP is set in advance in consideration of the shift amount of the threshold or the acceleration of the programming speed caused by the increase in the number of programming/erase cycles. However, the second embodiment dynamically changes the programming pulse of ISPP corresponding to the number of programming/erase cycles.

Figure 7:
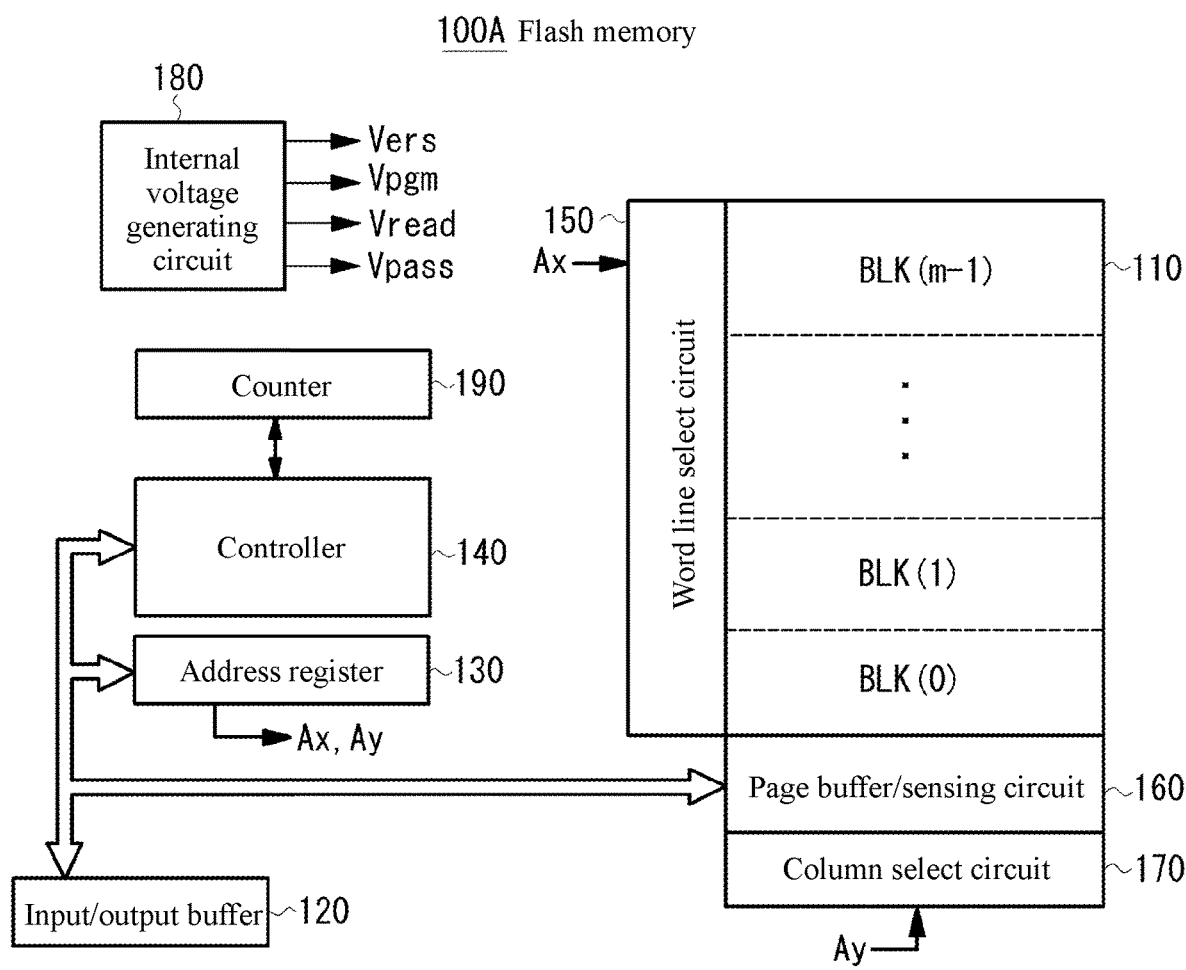
FIG. 7 is a block diagram illustrating the structure of a NAND flash memory of the second embodiment of the invention.

In the second embodiment, as shown in FIG. 7, a flash memory 100A further includes a counter 190 configured to count the number of programming/erase cycles. The controller 140 increments the counter 190 by one each time a programming operation and an erase operation are performed. Alternatively, in a case in which the counter 190 includes a first counter for counting the number of programming and a second counter for counting the number of erasing, the controller 140 increases the first counter by one when a programming operation is performed, and increases the second counter by one when an erase operation is performed. Furthermore, when the count value of the counter 190 reached a predetermined number, the controller 140 changes the setting of the programming pulses of ISPP corresponding to the number of programming/erasing cycles.

Figure 8:
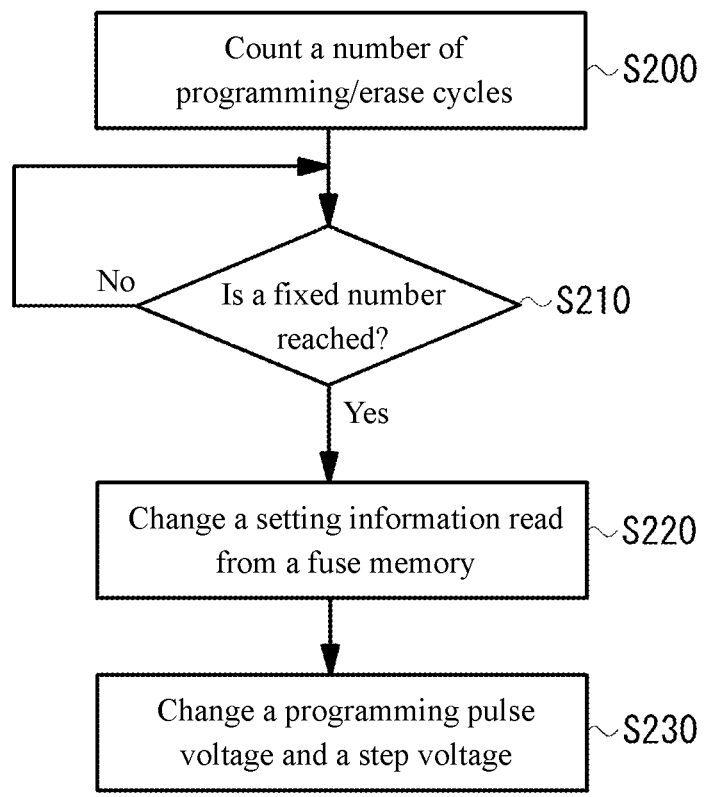
FIG. 8 is a flowchart illustrating the programming method of the second embodiment of the invention.

FIG. 8 is a flowchart showing the programming operation of the second embodiment. A number of programming/erase cycles is counted by the counter 190 (S200). If the controller 140 detects that a count value reached a fixed number (S210), a setting information set in a configuration register is rewritten (S220), and an initial voltage and step voltages of the programming pulses are changed (S230). For example, when the number of programming/erase cycles is less than a fixed number, the ISPP-based programming pulses are set like the values shown in FIG. 3, i.e., the step voltage is consistent, the initial voltage is set to 14.0 V, and the final voltage is set to 17.0 V. If the number of programming/erase cycles reaches a fixed number, the ISPP-based programming pulses are set as shown in FIG. 5. In other words, the ISPP-based programming pulses are changed to include the programming pulse P_FAST having an initial voltage configured to make the memory cell having fast programming speed unable to pass the program verification and a first step voltage smaller than the consistent step voltage, the programming pulse P_NORMAL with a second step voltage configured to make the memory cell with standard programming speed pass the program verification, and the programming pulse P_SLOW with a third step voltage configured to make the memory cell with slow programming speed pass the program verification. The third step voltage is greater than the second step voltage, and the second step voltage is greater than the first step voltage. In the present embodiment, the second step voltage is greater than the consistent step voltage.

In the second embodiment, an example of dynamically changing the setting of the ISPP-based programming pulses in two stages is shown, but the invention is not limited thereto. The number of programming/erase cycles may also be monitored in more stages (for example, three stages or four stages), and the setting of the programming pulses is changed when the number of cycles of the multiple stages is respectively reached. Furthermore, the number of programming/erase cycles may also be counted in units of blocks, and the setting of the ISPP-based programming pulses is changed in units of blocks. When there is a deviation in the number of cycles between blocks, it is effective to change the setting of the ISPP-based programming pulses for each block.

Figure 9:
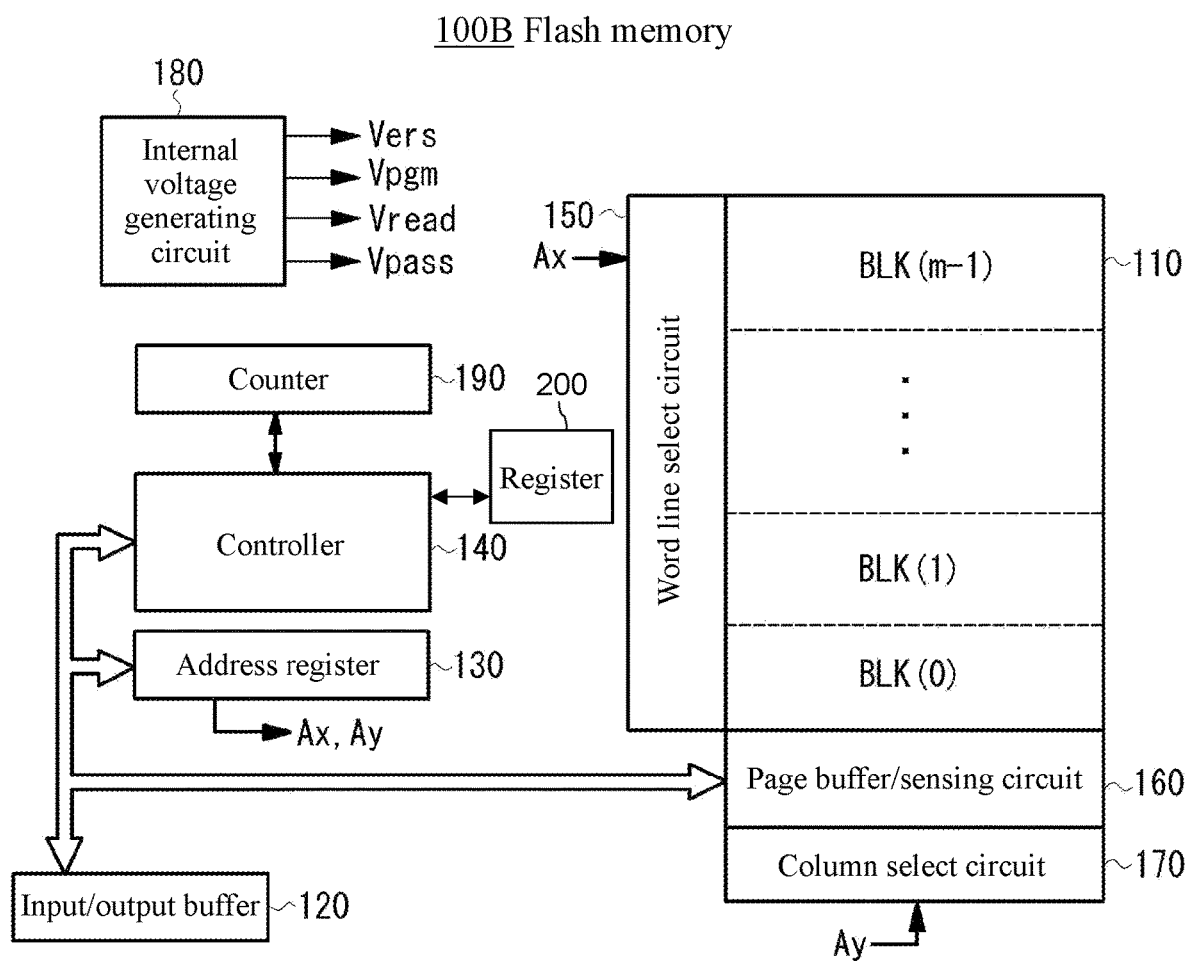
FIG. 9 is a block diagram illustrating the structure of a NAND flash memory of the third embodiment of the invention.

Next, the third embodiment of the invention is described. The third embodiment is related to optimizing the initial voltage of P_FAST based on ISPP set in the first embodiment or the second embodiment. In the third embodiment, as shown in FIG. 9, a flash memory 100B further includes a register 200 connected to the controller 140.

Figure 10:
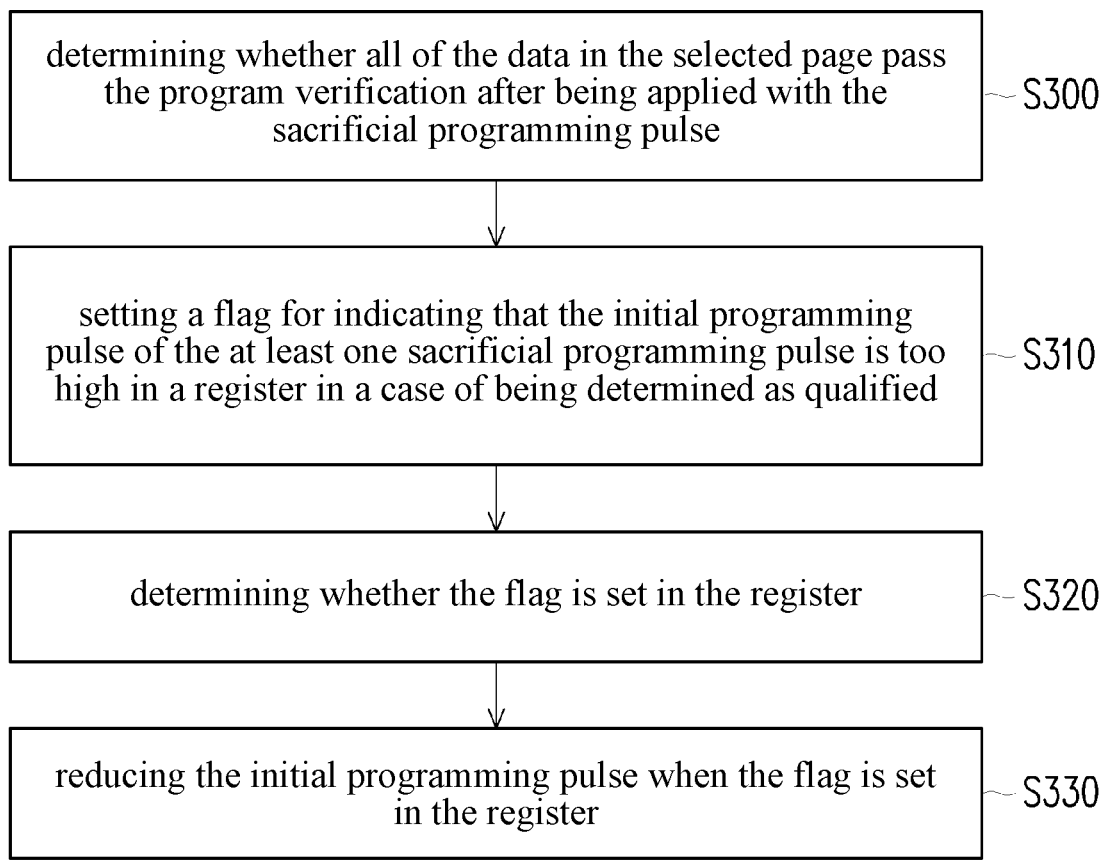
FIG. 10 is a flowchart showing the programming operation of the third embodiment.

FIG. 10 is a flowchart showing the programming operation of the third embodiment. In the third embodiment, it is determined whether all of the data in the selected page pass the program verification after being applied with the sacrificial programming pulse selected from the programming pulse P_FAST (S300). When all of the data (memory cells) applied with the sacrificial programming pulse pass the program verification, a flag is set in the register 200 (S310). Such a flag indicates that the initial voltage of the programming pulse P_FAST is too high, therefore the sacrificial programming pulse is not functioning.

At the beginning of the programming operation, the controller 140 determines whether a flag is set in the register 200 (S320). When a flag is set, the initial voltage of the programming pulse P_FAST is reduced by a fixed voltage (S330) (for example, in the example of FIG. 5, the initial voltage is reduced from 13.0 V by 1 V to 12.0 V). As a result, this prevents all data in the selected page from passing by the sacrificial programming pulse. Moreover, when a flag is not set in the register 200, the preset programming pulse P_FAST is applied.

As a result, according to the present embodiment, in a case in which all of the data of the selected page is qualified through the application of the sacrificial programming pulse, the initial voltage of the programming pulse P_FAST is reduced, thereby optimizing the programming pulse P_FAST. Moreover, in the example, a flag is set when all of the data is qualified through the programming pulse P_FAST. However, in addition to this, for example, a flag may also be set in a case in which data of a fixed number or more (for example, half or more) in the selected page qualified through the initial programming pulse of the programming pulse P_FAST. In addition, in the example, the initial voltage of the programming pulse P_FAST is lowered, but the other voltages in the programming pulse P_FAST may also be lowered.

In the embodiment, an example in which the programming pulse is applied up to six times is shown, but this is an example, and the programming pulse may also be applied more or less times. In addition, it should be noted that the voltages of the programming pulses or the step voltages shown in FIG. 3 or FIG. 5 are merely an illustration.

The preferred embodiments of the invention have been described in detail, but the invention is not limited to specific embodiments, and various modifications and changes may be made within the scope of the subject of the invention described in the claims of the invention.

What is claimed is:

1. A semiconductor memory apparatus, comprising:
   a NAND memory cell array; and
   a controller configured to apply a programming pulse based on an incremental step pulse programming in order to program a selected page of the NAND memory cell array;
   wherein the programming pulse comprises at least one sacrificial programming pulse such that a memory cell of the selected page cannot pass a program verification after being applied with the at least one sacrificial programming pulse, and the at least one sacrificial programming pulse comprises an initial programming pulse, and
   wherein the at least one sacrificial programming pulse comprises a plurality of programming pulses, the programming pulse further comprises other programming pulses, and a first step voltage between the sacrificial programming pulses is less than a second step voltage between the other programming pulses, wherein the controller is configured to determine whether the memory cells with a fixed number or all of memory cells in the selected page pass the program verification after being applied with the sacrificial programming pulse, and in a case of being qualified, the controller is configured to reduce the initial programming pulse applied in a next programming operation, wherein the semiconductor memory apparatus further comprises a register, wherein in a case of being qualified, a flag for indicating that the initial programming pulse of the at least one sacrificial programming pulse is too high is set in the register, and the controller determines whether the flag is set in the register, when the flag is set in the register, the controller reduces the initial programming pulse.

2. The semiconductor memory apparatus of claim 1, wherein the at least one sacrificial programming pulse is lower than a minimum programming pulse for making a memory cell for which a programming/erase cycle reached a fixed number pass the program verification.

3. The semiconductor memory apparatus of claim 1, wherein a third step voltage between a last programming pulse and a previous programming pulse thereof is greater than the first step voltage and the second step voltage.

4. The semiconductor memory apparatus of claim 1, further comprising a counter configured to count a number of programming and a number of erasing,
wherein the controller is configured to change the initial programming pulse according to the number counted by the counter.

5. A NAND flash memory programming method, comprising a step of applying a programming pulse based on an incremental step pulse programming in order to program a selected page of a memory cell array,
wherein the applied programming pulse comprises at least one sacrificial programming pulse such that a memory cell of the selected page cannot pass a program verification after being applied with the at least one sacrificial programming pulse, and the at least one sacrificial programming pulse comprises an initial programming pulse, and
wherein the at least one sacrificial programming pulse comprises a plurality of programming pulses, the programming pulse further comprises other programming pulses, and a first step voltage between the sacrificial programming pulses is less than a second step voltage between the other programming pulses,
wherein the programming method further comprises a step of determining whether memory cells with a fixed number or all of memory cells in the selected page pass the program verification after being applied with the sacrificial programming pulse, and in a case of being determined as qualified, the programming method further comprises a step of reducing the initial programming pulse applied in a next programming operation, wherein the programming method further comprises:
setting a flag for indicating that the initial programming pulse of the at least one sacrificial programming pulse is too high in a register in a case of being determined as qualified;
determining whether the flag is set in the register; and
reducing the initial programming pulse when the flag is set in the register.

6. The programming method of claim 5, wherein the at least one sacrificial programming pulse is lower than a minimum programming pulse for making a memory cell for which a programming/erase cycle reached a fixed number pass the program verification.

7. The programming method of claim 5, wherein a third step voltage between a last applied programming pulse and a previous programming pulse thereof is greater than the first step voltage and the second step voltage.

8. The programming method of claim 5, wherein the programming method further comprises a step of counting a number of programming and a number of erasing, and a step of changing the initial programming pulse according to the counted number.

9. A NAND flash memory programming method, comprising:
applying a programming pulse to a selected page;
perform a program verification after being applied with the programming pulse;
determining whether memory cells with a fixed number or all of memory cells in the selected page pass the program verification;
determining whether to optimize an initial voltage of a sacrificial programming pulse when the programming pulse is the sacrificial programming pulse, and the program verification after being applied with the sacrificial programming pulse is determined as qualified;
increasing the programming pulse in a case of the program verification being determined as not qualified;
in a case of determining to optimize the initial voltage, setting a flag for indicating that the initial voltage of the sacrificial programming pulse is too high, and reducing the initial programming pulse applied in a next programming operation in response of detecting the flag has been set.

10. The programming method of claim 9, wherein the sacrificial programming pulse is lower than a minimum programming pulse for making a memory cell for which a programming/erase cycle reached a fixed number pass the program verification.

11. The programming method of claim 9, wherein a step voltage between a last applied programming pulse and a previous programming pulse thereof is greater than a step voltage between the initial voltage and a subsequent programming pulse.

12. The programming method of claim 9, wherein the programming method further comprises a step of counting a number of programming and a number of erasing, and a step of changing the initial voltage according to the counted number.

* * * * *